US011683011B2

(12) United States Patent
Smeltzer

(10) Patent No.: US 11,683,011 B2
(45) Date of Patent: Jun. 20, 2023

(54) FAST SWITCHED PULSED RADIO FREQUENCY AMPLIFIERS

(71) Applicant: Weather Detection Systems, Inc., Evergreen, CO (US)

(72) Inventor: Rick Smeltzer, Evergreen, CO (US)

(73) Assignee: Weather Detection Systems, Inc., Evergreen, CO (US)

( * ) Notice: Subject to any disclaimer, the term of this patent is extended or adjusted under 35 U.S.C. 154(b) by 475 days.

(21) Appl. No.: 16/717,968

(22) Filed: Dec. 17, 2019

(65) Prior Publication Data

US 2020/0195198 A1 Jun. 18, 2020

Related U.S. Application Data

(63) Continuation of application No. 15/583,484, filed on May 1, 2017, now Pat. No. 10,530,301.

(60) Provisional application No. 62/486,214, filed on Apr. 17, 2017, provisional application No. 62/329,559, filed on Apr. 29, 2016.

(51) Int. Cl.
*H03F 1/02* (2006.01)
*H03F 3/193* (2006.01)
*H03F 3/217* (2006.01)
*G01S 7/282* (2006.01)

(52) U.S. Cl.
CPC .......... *H03F 1/0205* (2013.01); *H03F 3/193* (2013.01); *H03F 3/2171* (2013.01); *G01S 7/282* (2013.01); *H03F 2200/102* (2013.01); *H03F 2200/451* (2013.01)

(58) Field of Classification Search
CPC .................................................. H03F 1/0205
See application file for complete search history.

(56) References Cited

U.S. PATENT DOCUMENTS

| 5,929,702 | A | * | 7/1999 | Myers | ................ | H03F 1/0277 |
| | | | | | | 330/297 |
| 7,295,075 | B2 | | 11/2007 | Loraine | | |
| 7,369,822 | B2 | | 5/2008 | Loraine et al. | | |
| 7,649,958 | B2 | | 1/2010 | Macphail et al. | | |
| 8,331,486 | B1 | | 12/2012 | Zocher et al. | | |
| 9,020,453 | B2 | | 4/2015 | Briffa | | |

(Continued)

FOREIGN PATENT DOCUMENTS

EP 975089 1/2000

OTHER PUBLICATIONS

PCT International Patent Application No. PCT/US2017/030404, International Search Report and Written Opinion dated Aug. 24, 2017, 12 pages.

(Continued)

*Primary Examiner* — Patricia T Nguyen
(74) *Attorney, Agent, or Firm* — Spencer Fane LLP

(57) ABSTRACT

A switching system is connected to the power amplifier of an RF system. The switching system can switch the DC supply voltage to the power amplifier while handling the high DC current and the nanosecond switching speed requirements that are mandatory for most RF systems. The embodiments can rapidly control DC voltages but not interfere with the optimized operation of the RF transistor. The embodiments provide a desired sharp turn-on leading edge for an RF pulse while eliminating the extremely long and undesirable ramp down that typically occurs beyond the desired RF pulse period.

18 Claims, 12 Drawing Sheets

(56) References Cited

U.S. PATENT DOCUMENTS

| | | |
|---|---|---|
| 9,438,172 B2* | 9/2016 | Cohen .................. H03F 3/21 |
| 9,923,520 B1* | 3/2018 | Abdelfattah ............ H03F 3/245 |
| 10,530,301 B2 | 1/2020 | Smeltzer |
| 2008/0290938 A1 | 11/2008 | Gupta et al. |
| 2012/0146731 A1* | 6/2012 | Khesbak .................. H03F 3/72 |
| | | 330/295 |
| 2012/0194274 A1* | 8/2012 | Fowers .................. H03F 3/191 |
| | | 330/293 |
| 2012/0293253 A1* | 11/2012 | Khlat .................... H03F 1/0244 |
| | | 330/127 |
| 2012/0313709 A1 | 12/2012 | Lautzenhiser |
| 2013/0141063 A1* | 6/2013 | Kay .................... G05F 1/468 |
| | | 323/271 |
| 2014/0203958 A1 | 7/2014 | Okuda |
| 2014/0375382 A1* | 12/2014 | Midya .................... H03F 3/217 |
| | | 330/127 |
| 2016/0056770 A1 | 2/2016 | Delepaut |
| 2016/0065204 A1 | 3/2016 | Zojer |
| 2016/0261243 A1 | 9/2016 | Adabi |
| 2017/0317647 A1* | 11/2017 | Smeltzer .............. H03F 3/2171 |

OTHER PUBLICATIONS

PCT International Patent Application No. PCT/US2017/030404, International Preliminary Report on Patentability dated Nov. 8, 2018, 9 pages.

\* cited by examiner

FAST SWITCHED PULSED RADIO FREQUENCY AMPLIFIERS

CROSS REFERENCE TO RELATED APPLICATIONS

The present application claims the benefits of and priority, under 35 U.S.C. § 119(e), to U.S. Non-Provisional application Ser. No. 15/583,484, filed May 1, 2017, entitled "FAST SWITCHED PULSED RADIO FREQUENCY AMPLIFIERS," which is incorporated herein by reference in its entirety for all that it teaches and for all purposes, and to U.S. Provisional Application Ser. No. 62/329,559, filed Apr. 29, 2016, entitled "SWITCHING METHOD TO MITIGATE HEAT IN TRANSISTOR BASED PULSED RF POWER AMPLIFIERS," which is incorporated herein by reference in its entirety for all that it teaches and for all purposes, and to U.S. Provisional Application Ser. No. 62/486,214, filed Apr. 17, 2017, entitled "SWITCHING METHOD TO MITIGATE HEAT IN TRANSISTOR BASED PULSED RF POWER AMPLIFIERS," which is incorporated herein by reference in its entirety for all that it teaches and for all purposes.

FIELD

The present disclosure is generally directed to power amplifiers, in particular, toward controlling power amplifiers in radio frequency (RF) systems.

BACKGROUND

RF systems, for example, Doppler Radar used for tracking weather systems, include power amplifiers to drive the signal sent from the antennae. Doppler Radar and other similar RF systems may send a pulsed RF signal. To generate the pulsed RF signal, a pulsed RF power amplifier must change power from a direct current (DC) power supply into the pulsed signal by changing the signal with RF transistors.

Amplification of low power signals is a cornerstone of many modern radio frequency devices. Examples include pulsed telemetry, radar, electronic countermeasures, and other applications including electronic warfare. Solid state power amplifiers used in RF applications can vary from single transistor designs to multiple combined transistors to meet specific power requirements of system designers.

Gallium Nitride devices are now the top choice for the power transistors due to their very high efficiency and long life. The typical structure of a transistor is a semi-conducting material located on substrate with a minimum, but not limited to, three connections to the electrical circuit. Two architectures commonly used in RF transistors are bipolar junction transistors (BJTs) and Field Effect Transistors or (FETs). The connections associated with BJTs are usually labeled as Emitter, Base, and Collector, while FETs label the circuit connections as Gate, Source, and Drain. Transistors used in amplifying circuits have outputs higher than the respective inputs. In current RF transistor designs, typically a negative voltage is applied to the Gate connection, the Source is generally connected to the ground or return, and the Drain is the higher voltage and higher current that powers the transistor.

Generally, the Drain side of the transistor is continuously powered, which creates heat, uses a large amount of power, and generates signal noise in the signal. The Gate function, or switch side in an RF device acts to limit current to a prescribed value to protect the device from self-destruction and additionally provides the low signal RF input. In an RF FET, the Gate side of the transistor also serves as the RF input while the drain is the output. Voltages applied to the Gate are referred to as a bias. The control voltages may be positive or negative with respect to the Source or return.

Semiconductor device manufactures publish specifications regarding the proper bias for FETs. An example of this specification would be a common RF FET having a Drain supply voltage of 50 volts DC and a Gate voltage of negative 2.7 volts that limits the current that is drawn on the Drain side of the transistor. A proper Gate voltage provides the best efficiency and the longest life.

Semiconductor designs can be optimized for operation in certain areas of the radio frequency spectrum. This design optimization may be both a critical requirement and a detriment. In a typical high power microwave amplifier, many stages of gain, or amplification, are required to produce a meaningful outcome signal. The multi-gain stage designs introduce significant noise into the system. During operation within a circuit, without any RF signal present, transistors create noise or oscillate within the desired band of operation and continue to draw operating current from the DC power supply while no signal is present for amplification (known as the inter-pulse period). Amplifier designers now rely on the integration of high power RF switches to address this noise.

These RF switches are very expensive and consume valuable space within the amplifier. In addition, the RF switches lack the power handling required. The other major undesired result of using the RF switches is the heat generated by the devices, which requires thermal management systems and techniques. A typical high-gain, high-power, solid-sate amplifier can use large high-surface area heatsinks with fans to move the required volume of air needed to cool the RF switches. Some power solid state amplifiers may require complex and problematic liquid cooling systems consisting of pumps, tubing, and radiators. These cooling systems are large, heavy, and potentially complex, with reliability and maintenance issues.

The basic transistor structure above has several issues. As mentioned above, the Drain side of the transistor is powered continuously, which is problematic. The presence of this continuous power results in high heat, high current consumption, and unwanted noise—all significant and unavoidable problems.

Using the pulsed radar amplifier as an example, an approach might be to turn the transistor completely off during the non-pulse period, or intra-pulse period. Since pulsed signals have a short duration, e.g., in nanoseconds, the requirements of switching the transistor are challenging. Previous approaches have been to switch the gate side of the transistor between the optimum value for best efficiency and a full rail voltage to completely shut off the RF flow thru the transistor. Since the gate control voltages and current are much lower than the drain side, attempts to enhance performance with this method were unsuccessful. At the maximum gate bias the transistor continued to create noise. Switching the high voltage high current drain side effectively shuts down the transistor. A solution had to be realized using an ultra-fast DC switch that would perform at both the speed and high current required. Thus, there is still a need to create a switching solution for the above problems.

Figure 1:
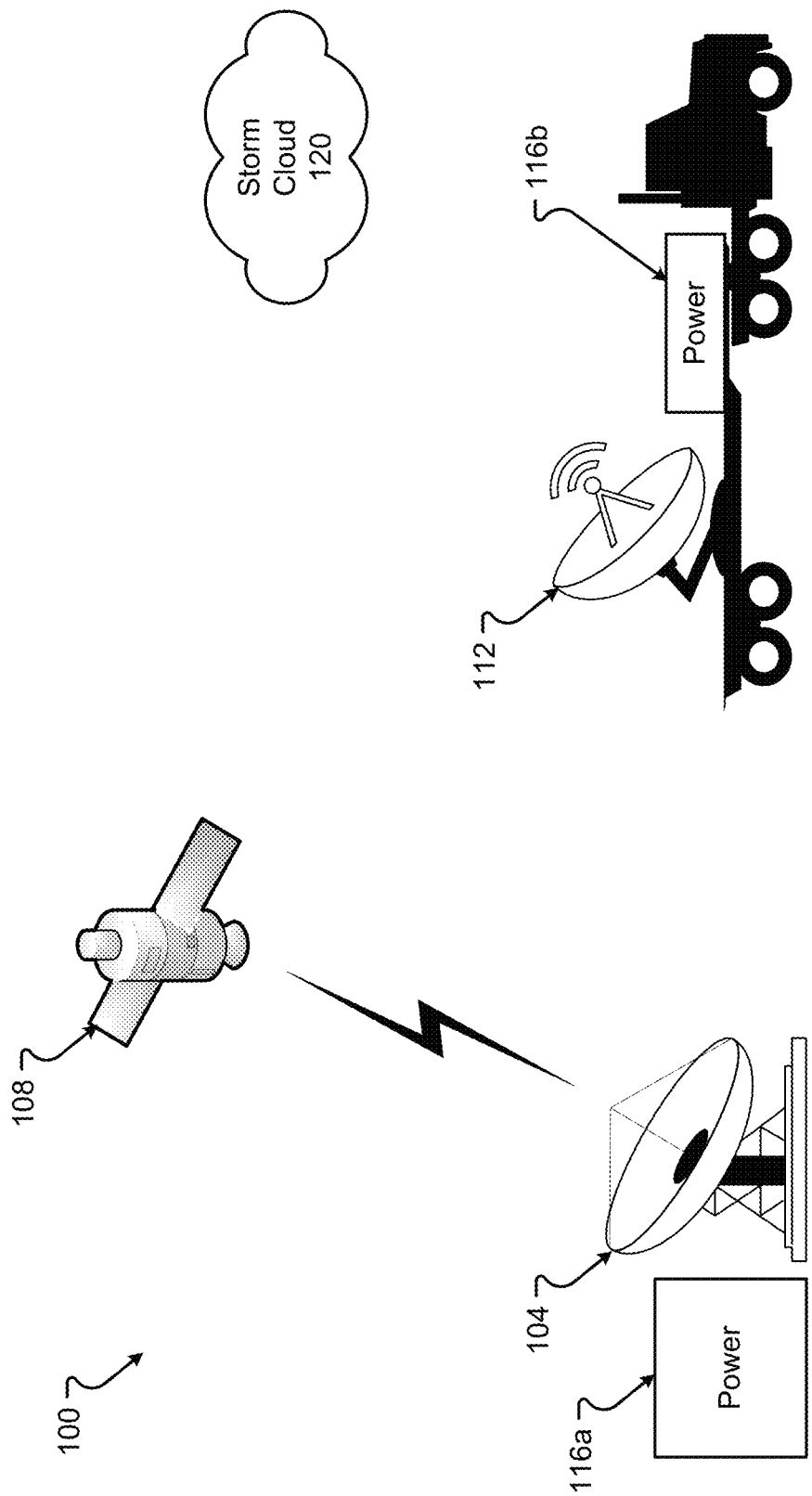
FIG. 1 shows an environment including one or more RF systems in accordance with embodiments of the present disclosure.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

The embodiments presented herein help resolve some or all three of issues with the development of a very fast, high speed, high current DC switching circuit that powers the drain supply circuit of a RF power amplifier transistor. The embodiments described herein provide the advantages of significantly reducing the size and weight of the power systems needed to drive RF transmissions.

Generally, neither metal oxide semi-conductor field effect transistors (MOSFETs) or perhaps an isolated gate bipolar transistor (IGBTs) can remedy the above problems. Unfortunately, neither of the above device devices has the speed required to switch the DC drain current on and/or off and are not in a usable form factor or package. Recent developments in Gallium Nitride technology provided in some of the latest RF Gallium Nitride FETs (GaNFETs) have provided possibilities of solving some of the issues in RF systems, such as providing a novel, purpose built switch circuit to turn on and off the drain supply of the RF power amplifier transistors. The high speed GaNFET switch very effectively solves the high thermal output, high current consumption, noise, and the size and weight issues.

The novel and unobvious switching system described herein had to address the high DC current handling and the nanosecond switching speed requirements that are mandatory for most RF systems. The embodiments herein had to rapidly control DC voltages but not interfere with the optimized operation of the RF transistor. It was discovered during development of the GaNFET switch that, due to the capacitance of the GaNFET and the slow decay of energy after voltage had been switched off, undesirable characteristics of the pulsed signal were created. The embodiments provided the desired sharp turn-on leading edge for the pulse while an extremely long undesirable ramp down occurred beyond the desired RF pulse period.

Most FET's incorporated into switching power supplies, lamp dimmers, inverters, or motor speed controls can work well in applications with poor trailing edge characteristics explained above, but do not meet the requirement of a typical RF circuit. To better shape the pulsed signal, a secondary GaNFET was added in a H Bridge circuit to discharge the remainder of the stored charge energy in the RF transistor after the desired pulse period.

To be a viable solution as a fast DC switch specific for a RF application, the embodiments herein provide a fast ramp on and ramp off times, in the order of nanoseconds, without leading edge overshoot ringing that is typical in switching circuits. Timing of the GaNFET ON/OFF is critical for both system performance and to prevent self-destruction of the DC FET switch. The elimination of stored energy after the desired RF pulse was a critical step in achieving a working circuit. In application, the remaining energy held within the RF transistor had to be taken directly to ground to realize a useable falling edge of the pulsed signal. Lab testing has shown that during the OFF cycle of the switched pulse as much as 2.5 amps was discharged over 10 nanoseconds. The decoupling circuit was adjusted to provide both the best pulse shape and long term survivability of the DC FET switch.

Multiple methods have also been developed to control the switched amplifier, for example, a control circuit can use fixed value components of the GaNFET driver, an advanced control that may incorporate a programmable logic device (PLO), a micro controller, and/or a field programmable gate array (FPGA). When the control scheme is implemented, dynamic adjustment of the switching circuit is possible to compensate for different responses from a multitude of available and future RF transistors or advances made to the GaNFET switches themselves. Such programmable control additionally adjusts for manufacturing variance.

To control the pulsed RF amplifier, a system trigger may be introduced either internally or externally by, for example, the radar master clock, a signal processor, and/or a system trigger derived from detected incoming RF pulses. The "detected pulse" approach constantly monitors the input RF signal and amplified RF signal output to automatically trigger the amplifier and GaNFET switch. A processor can monitor system timing, amplifier response, duty cycle limit protection, voltage alarms, and gain values to adjust for optimum performance of the RF system.

Integration of the amplifier into any system design is possible as the design is flexible. Operation of the switched amplifier can be used to switch either a continuous wave (CW) RF input, or Gate a pulsed RF input signal. This feature can eliminate the requirement of any RF switching ahead of the amplifier if a pulsed output is desired and only a CW source is available.

The size, weight, power consumption, and unwanted RF noise have been a serious limiting factor for current RF systems. Many of the currently-available pulsed amplifiers exhibit noise during the time between pulses (known as the Intra-pulse interval). The noise in current systems can have a significant impact when such amplifiers are a part of sensitive system, such as a Doppler radar. Current radar system must sample the system noise, then use the sampled value to establish a zero signal over noise ratio. Depending on the amplitude of the introduced noise, a sensitive receiver in a current radar system may suffer significant loss in low end sensitivity and loss of overall dynamic range. The embodiments herein eliminate or substantially reduce the noise introduced by the RF power amplification.

The embodiments herein can yield significant benefit in both thermal management, reduction of phase noise in the RF output signal, and significant reduction of required operating current. Tests on at least some of the embodiments presented herein have also shown significant reductions in both generation of waste heat and requirement of large high current DC power supplies. The significance of these reductions become apparent when a radar system onboard of any type of aircraft or UAV, or spacecraft is restricted by form factor (physical size and weight), available power budget of the vehicle, and cooling requirements. Modern radar system design has been moving in the direction of placing critical RF components on the antenna structure to eliminate traditional losses associated with long lengths of transmission line, wave guide, or coax. Currently available high-powered solid-state transmitters were of an unusable size and weight to incorporate on an antenna or for anything other than ground based systems. can enable further advancement in future system architecture for phased-array radars and other systems.

The embodiments herein can switch a solid-state power amplifier (SSPA) that may include at least one transistor having a gate, a source, and a drain. A DC supply may be selectively connected to the drain that using a pair of GaNFET switches configured in a traditional H-Bridge circuit configuration. The GaNFET switches provide a very rapid "turn-on" of the RF transistor drain circuit, and/or a rapid quench, or dump to ground when the RF transistor drain circuit is "turned off." The RF transistor and the associated RF to DC de-coupling circuits have characteristics closely resembling a capacitor. Requirements for radar pulses, for example, require steep ramping of the turn on (the leading edge of the signal), and the turn off (the trailing edge of the signal) of DC voltages that supply the drain side of the RF transistor such that all stored energy is expended at the end of the desired pulse. The GaNFET switches provide this rapid on and off of the DC voltage at the drain of the amplifier.

Other components of the RF amplifiers include a DC power supply that provides required voltages to the system components that can include a voltage regulator, an inverting supply used for transistor bias (gate voltage), a transistor drain through the GaNFET switch (switched DC), control and monitoring circuitry including, for example, logic devices (PLD or FPGA) and/or possibly outside connections, Ethernet and/or serial control. Other components may include RF transmission lines between RF components, which can include Wave Guide, Coax, Micro-strip, and or Strip-line, an RF power divider network, an RF power combiner network and matching circuitry, an RF circulator and/or isolator, resistors, capacitors and inductors, and chokes required for system control and de-coupling of RF from DC, and/or a mechanical housing that additionally provides RF shielding to the outside environment. Example circuitry is provided hereinafter.

With the high-speed switched transistor drain circuitry, the embodiments herein can eliminate waste heat, which has significant impact on the architecture of RF transmitter designs. For example, existing high powered solid state amplifiers, with four phase combined channels incorporating RF transistors, may each draw one amp of current with a drain supply voltage of 50 volts, or generate 50 watts of power. The sum of the heat across the four channels would be 200 watts of dissipated waste heat. Not exceeding the transistor's manufacture's guidelines (typically 25-degrees C.) for baseplate temperature is paramount to ensure the long life of the device. Based on the temperature rise and variances in ambient temperature, a very large surface area for the baseplate is required, along with forced air or a liquid cooling means, to mitigate the generated heat in current RF designs.

The embodiment herein of the solid state high power amplifier (SSHPA) has unmatched efficiency based upon the ability to control the ON time of the RF transistors through the use of a high-speed on/off switching mechanism. The result of this high-speed switching significantly reduces energy consumption, eliminates waste heat and its detrimental distortion, and significantly improves power efficiency in the pulsed amplifiers. The size of the DC power supply can be greatly reduced by a factor of four. These methodologies also solve the challenges of thermal management. The minimal waste heat can eliminate the need for heat sinks. These design changes allow for a crucial and significant reduction in the overall weight and size of the amplifier allowing for integration into systems with tight constraints such as airborne or space-borne platforms.

Significantly, current solid state amplifiers cannot achieve the higher power densities. Pulsed radar performance is dependent on fulfillment of the required gain and power output. An additional requirement is very low phase noise to enable enhanced detection of targets with very low amplitude signatures with Doppler velocity detection well under current thresholds. The embodiments provided herein can achieve the higher power densities matching or exceeding traditional vacuum tube microwave devices with these new methodologies.

Further, the switching methods herein greatly reduces the waste heat produced by an RF transistor, which may then be dissipated into the amplifier structure rather than a heatsink. The target temperature manufacturers typically use is 25° C. base plate temp for optimal life and performance. The maximum life of a transistor is based on maintaining and/or not exceeding this temperature. The embodiments herein greatly improve the life expectancy of a transistor because this temperature is not exceeded or approached.

Our switching method also can allow the system to turn off the transistor at a predetermined the right time to reduce noise at the trailing end of the pulse. This change in switching the transistor off re-defines the intra-pulse noise floor. The resultant noise reduction allows detectability and sensitivity measurements not capable with previous designs. The deduction in noise greatly benefits end users using the radar for surveilling, searching, and characterizing weather systems that need to lower the Doppler detectability threshold.

In some configurations, a programmable logic device (PLD) or FPGA can control the GaNFET DC drain switching. When using a PLD or FPGA to control the GaNFET DC switch, the FPGA's or PLD's internal logic and monitoring of parameters, for example, temperature, voltage, current, input and output RF characteristics, can control the operation of the GaNFET DC switch. Control of the GaNFET switch through the PLD or FPGA allows for dynamic compensation of the amplifier performance over a wide variance of operating conditions. This flexibility also allows the use of a multitude of different RF transistors in the design of the amplifier based on the ability to program the PLD or FPGA with the operating characteristics of the transistor.

The embodiments herein are not only an amplifier but a switch too. These designs compensate for poor legacy components that may be noisy, adjusts for a wide variance of ambient conditions, is self-monitoring, and is easy to integrate for the end-user. Importantly, the embodiments now also precisely monitor the duty-cycle of the transistor and can prevent the transistor from exceeding the maximum design rating.

An embodiment of an environment 100 for providing RF communications or signals may be as shown in FIG. 1. In the environment, an antenna 104, 112 may provide or transmit an RF signal. The RF signal may be projected towards a recipient, for example, a spacecraft 108 or other antenna (not shown). In some examples, the antenna 112 may project an RF pulsed signal towards a weather system or storm cloud 120 and receive signals back to determine a Doppler shift in the reflected signal for weather analysis.

The environment 100 can include different types of RF signal including pulsed RF signaling, which may be used in at least some of the following description. The RF antennas 104, 112 may be powered by a power supply 116a, 116b. The power supply 116 can provide the desired gain in signal strength to the antenna 104, 112. The gain may be generated through a series of power amplifiers as explained hereinafter.

Figure 2:
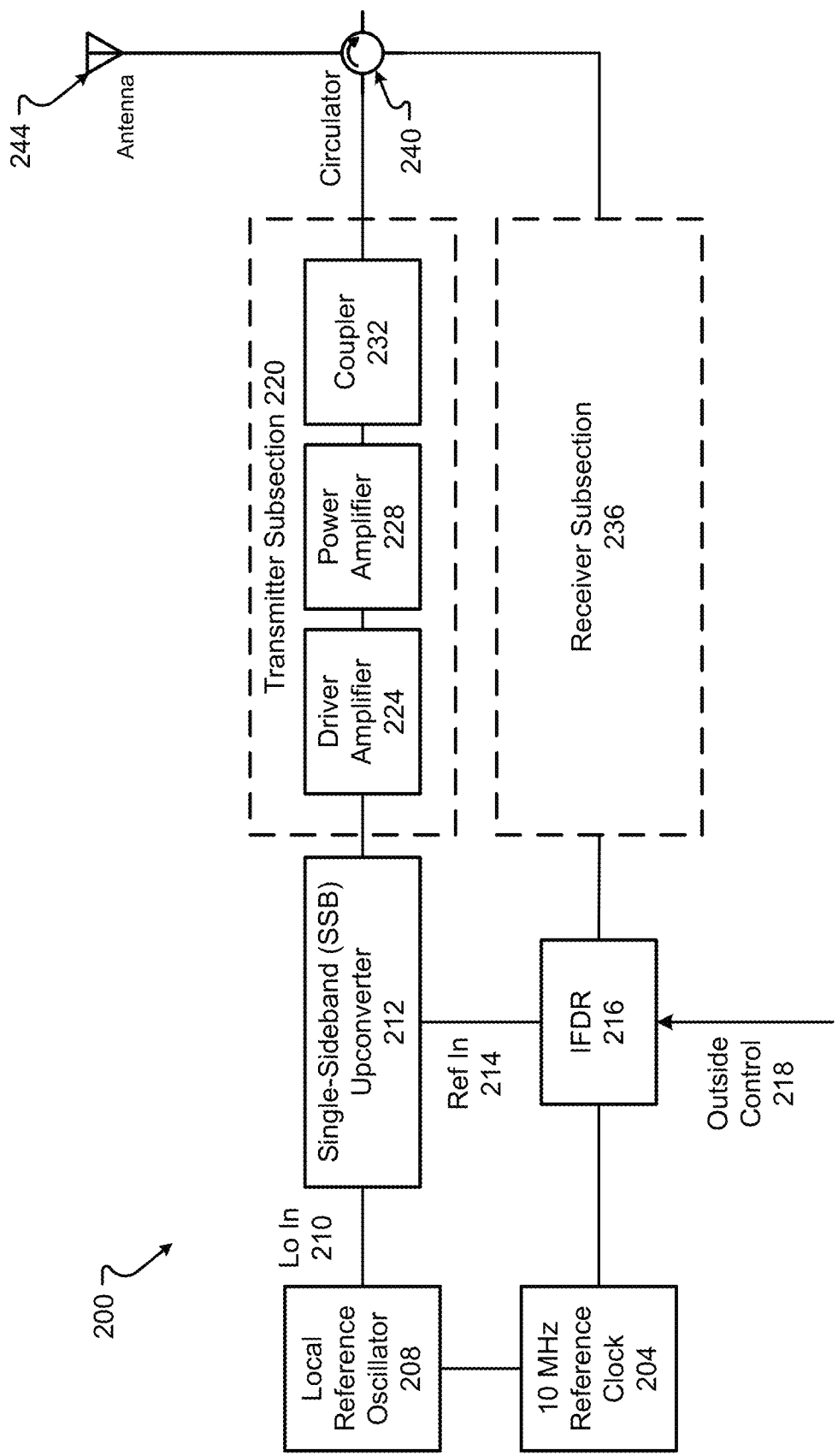
FIG. 2 is a block diagram of an RF system in accordance with at least some embodiments of the present disclosure.

An example of an RF system 200 (which is provided for explanation purposes and is not limiting to the RF systems that may employ the power amplification circuitry described hereinafter) may be as shown in FIG. 2. The RF system 200, shown in the example in FIG. 2, may be a simple diagram for a Doppler radar system. The RF system 200 can receive a master system clock signal from a master reference clock 204. The clock signal may be received from some source or generated by an oscillator or other component. For the present example, the master reference clock may be a 10 MHz system clock. The 10 MHz signal may be provided to a local reference oscillator 208.

The local reference oscillator 208 provides for the reference signal to be provided to the single-sideband (SSB) upconverter 212 and to the receiver subsection 236 for processing of a received signal. In electronics, a local reference oscillator 208 provides the signal, "Lo In" 210, that is used with a mixer to change the frequency of a signal. The frequency conversion process, also called heterodyning, produces the sum and/or difference frequencies from the frequency of the local oscillator and frequency of the input signal. Processing a signal at a fixed frequency gives a radio receiver/transmitter improved performance. In many receivers/transmitters, the function of the mixer is provided in a converter, for example, the SSB upconverter 212.

An intermediate frequency digital receiver (IFDR) 216 may provide the intermediate frequency 214 into the single-sideband upconverter 212. An intermediate frequency (IF) is a frequency to which a carrier wave is shifted as an intermediate step in transmission or reception. The IF is created by mixing the carrier signal, provided as or with an outside control signal 218, with a local oscillator signal 210 in a process called heterodyning, resulting in a signal at the difference or beat frequency. Intermediate frequencies are used in RF transmitters/receivers, in which an outgoing/incoming signal is shifted to an IF for amplification before final transmission/detection is done.

Here, the single-sideband converter 212 may mix the reference signal 214 with the Lo In signal 210 and then upconvert the mixed IF signal. In RF communications, single-sideband modulation (SSB) mixes the Lo In signal 210 having a specific frequency, the carrier wave, with the signal to be broadcast, signal 214. The result is a set of frequencies with a strong peak signal at the carrier frequency, and smaller signals from the carrier frequency plus the maximum frequency of the signal, and the carrier frequency minus the maximum frequency of the signal. That is, the resulting signal has a spectrum with twice the bandwidth of the original input signal. The mixed-frequency signal may then be provided to the driver amplifier 224 of a transmitter subsection 220.

The driver amplifier 224 can be a driver for the power amplifier circuit 228 and/or an initial amplifier for the mixed signal. Thus, the driver amplifier 224 can be an electrical circuit or other electronic component used to control the power amplifier 228. For example, the driver amplifier 224 may be a specialized integrated circuit that controls the high-power switches in the switched-mode power converters of the power amplifier 228. Further, the power amplifier 224 can ramp up the amplitude of the mixed signal before being further amplified by the multi-stage power amplifier 228 (final stage amplification).

The mixed signal may then be provided to the power amplifier 228, under control of the driver amplifier 224. In many configurations, the power amplifier 228 may be a multi-stage power amplifier, which can amplify the signal up to a desired gain in two or more stages. In other words, the power amplifier 228 may comprise two or more amplifiers that successfully amplify the input signal up to a desired gain. Each power amplifier 228 can be a RF power amplifier that converts a low-power radio-frequency signal into a higher power signal. Typically, RF power amplifiers drive the antenna 240. As explained previously, RF power amplifiers are designed to meet requirements such as gain, power output, bandwidth, power efficiency, linearity (low signal compression at rated output), input and output impedance matching, heat dissipation, etc. An example of a RF power amplifier circuit 228 may be as described in conjunction with FIG. 3.

The amplified signal may then be sent to a power coupler 232. The power coupler 232 can provide a power sample to the receiver section 236 through a mixer. Further, the power coupler 232 can be used to tune the antenna 244. The amplified signal for transmission may then be sent through a circulator 240 to the antenna 244. Any received or reflected signal may be received through the antenna 244 and the circulator 240 switch to provide the received signal to the receiver subsection 236. The receiver subsection 236 may then provide the received signal through a limiter, low-noise amplifier, image rejection mixer, etc. into the intermediate frequency digital receiver 216. The IFDR 216 may then analyze and/or send the signal to outside processing.

Figure 3:
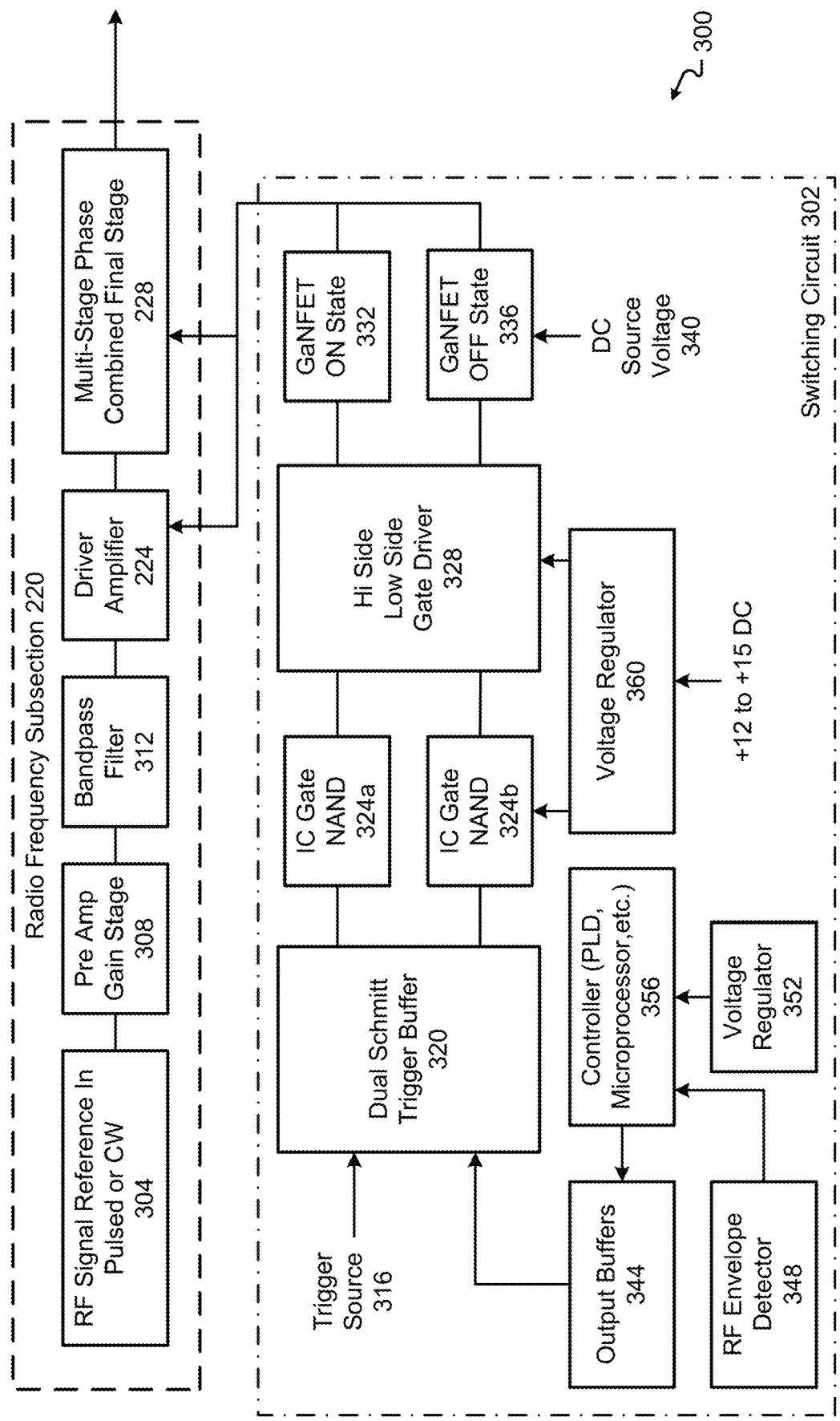
FIG. 3 is a block diagram of an RF system with a drain switching circuit in accordance with at least some embodiments of the present disclosure.

An embodiment of the RF transmitter subsection 220, connected to the switching system 302 may be as shown in FIG. 3. This combination of the RF circuitry 220 and switching circuitry 302, shown in the circuit 300, may provide the high-speed switching necessary as described hereinbefore.

Figure 4:
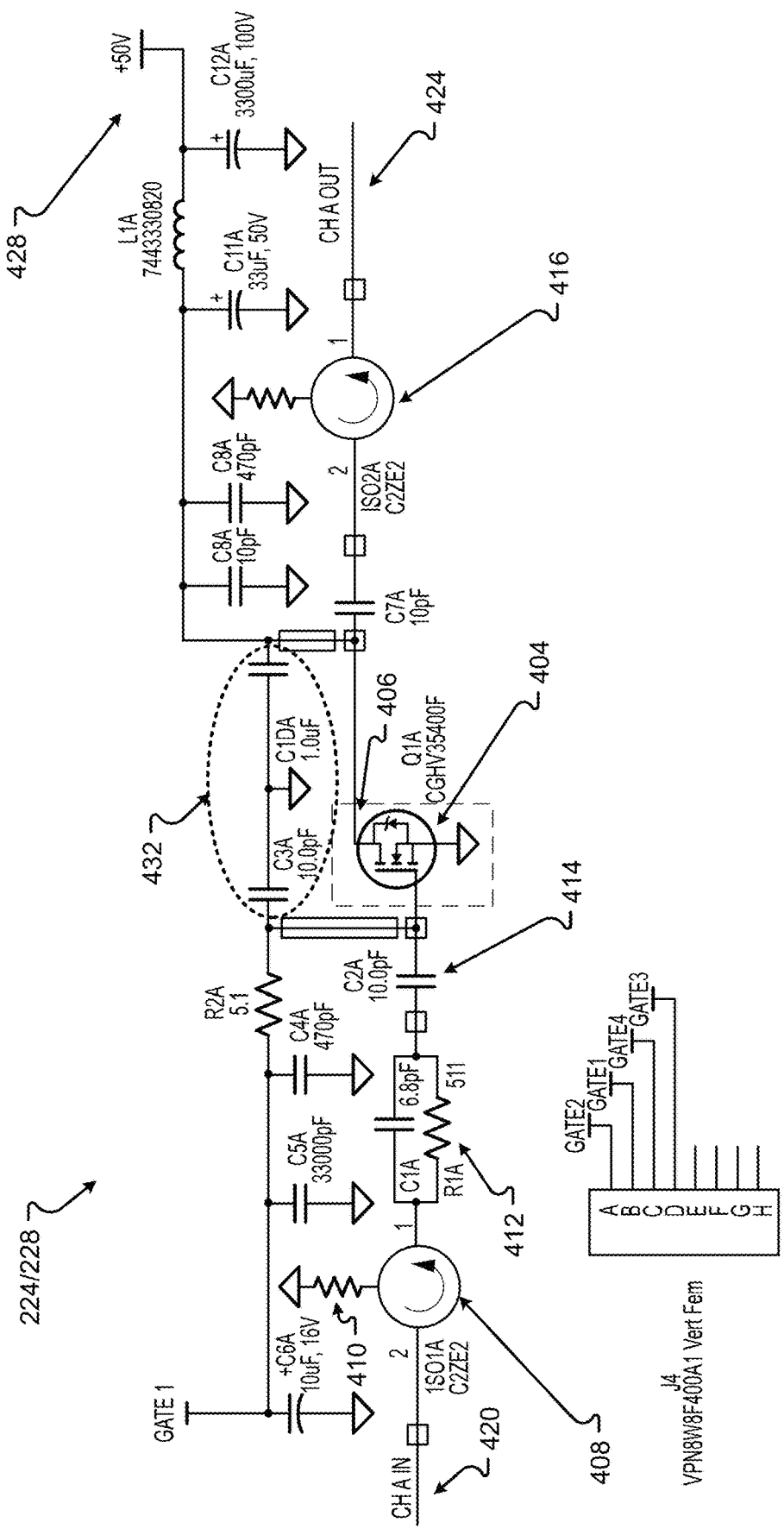
FIG. 4 is a circuit diagram of the RF power amplifier in accordance with embodiments of the present disclosure.

An embodiment of the switched RF circuitry 300 may be as shown in FIG. 3. First, the RF signal 304, which may be a pulsed or CW signal, can enter a preamplifier 308 to increase the gain of the signal 304. A preamplifier 308 "pre-amp" is an electronic amplifier that converts a weak electrical signal into an output signal strong enough to be noise-tolerant and strong enough for further processing, e.g., for sending to a power amplifier and an antenna. Without the pre-amp 308, the final signal at the antenna 244 may be noisy or distorted after power amplification. A bandpass filter 312 can then condition the signal from the pre-amp 308 to eliminate any noise or harmonics already present in the signal. The driver amplifier 224 and/or multi-stage amplifier 228 then amplify the signal to reach a desired gain before transmitting the signal through the antenna 244. An example of a stage of the amplifier 228 may be as shown in FIG. 4.

The switching circuitry 302 can switch the DC voltage provide to the power amplifiers 224/228 used to increase the gain of the input signal before transmission through the antenna 244. A reference signal or trigger source 316 can trigger the circuit 302. In some configurations, the trigger source 316 may be an external trigger from a system processor. For example, upon determining that an RF communication be sent, a system processor can send a transistor-transistor logic (TTL) signal to the dual Schmitt trigger buffer 320 to begin switching of the DC voltage to the power amplifiers 224/228. In other configurations, a RF envelope detector 348 can receive an input RF signal and identify a leading edge of the RF envelope. For example, the RF envelope detector 348 can be RF detectors, part number LTC5583, manufactured by Linear Technologies, Inc. of Milpitas, Calif. The RF envelope detector 348 can send a signal to a controller 356, upon detection of the RF envelope, to trigger the switching circuit 302.

The controller 356 may be a programmable logic device (PLD), a microprocessor, an application specific integrated circuit, a FPGA, etc. As a PLD, the controller 356 need not include an onboard memory to execute a programming logic. As such, the PLD may have advantages in the embodiments herein for use in space or other hostile environments where memory can be corrupted. Regardless, the controller 356 can control all or some of the components of the switching circuit 302.

The PLD 356 will be used to describe the controller 356, but the controller 356 is not so limited and may comprise other types of processors or controllers as described above. The PLD 356 can force triggering of the switching circuit 302. For example, the PLD 356 can receive a signal indicating the detection of the RF envelope from the RF envelope detector 348. From this information, the PLD 356 may send a signal to an output buffer 344. The output buffer 344 can time triggers sent to the dual Schmitt trigger buffer 320. The output buffer 344, therefore, may be some type of cache, memory, or other circuit used to time and trigger the Schmitt trigger buffer 320.

The voltage regulator 352 may also input information to the PLD 356. The voltage regulator 352 may also provide a set voltage to be provided to circuit components and/or the PLD 356, which then could be used for triggering the output buffer 344. Further, there may be control information provided to the PLD 356 from the voltage regulator 352 regarding the performance of the switching circuit 302.

The dual Schmitt trigger 320 can receive signals in analog form and convert those to digital form for provision to the IC gate(s) 324a, 324b. An example of the dual Schmitt trigger buffer 320 and related circuitry may be as described in conjunction with FIG. 5A. Generally, a Schmitt trigger 320 is a comparative circuit that has a positive feedback loop. The Schmitt trigger 320 can convert an analog input signal to a digital output signal. Thus, the dual Schmitt trigger buffer 320 can receive an analog trigger source signal 316, such as an RF signal, and create a digital output based on that analog RF signal input 316. The Schmitt trigger 320 may also have different levels for output that can be custom-provisioned to create a predetermined RF envelope for triggering the switching of the DC voltage source 340 that is provided to the amplifiers 224, 228. Thus, the Schmitt trigger 320 can create an on state before the RF pulse signal needs to be sent and an off state after the RF pulse has been sent. As such, the envelope for providing DC voltage to the radio frequency subsection 220 may be larger than the actual pulse signal, ensuring that the entire pulse is sent during amplification, or may be custom designed based on the requirements for the RF transmission. The dual Schmitt trigger 320 may provide the digital output to one or more integrated circuit (IC) gates 324a, 324b.

The IC gates 324 can be a "not AND" (NAND) circuit. A NAND gate 324 can implement logic for NAND function. In other words, the NAND gate 324 is an inverted AND gate, where, if both signals are low, the NAND gate 324 outputs a high signal and, if both gates are high, the NAND gate outputs a low signal. If the inputs are different, then the output is also high signal. An example of the IC NAND gates 324, and the related circuitry, may be as described in conjunction with FIG. 5B. The NAND gates 324 can output signals to a high-side/low-side gate driver 328.

The high-side/low-side gate driver 328 can receive a signal(s) from the NAND gates 324 and amplify those inputs to drive the switches 332, 336, which are shown as GaN-FETs. The high-side/low-side gate driver 328 can trigger the "on state" GaNFET 332 and/or the "off state" GaNFET 336. An example of the high-side/low-side gate driver 328, and the associated circuitry, may be as shown and described in conjunction with FIG. 5B.

A voltage regulator 360 may provide DC voltage to the IC gates 324 and the high-side/low-side gate driver 328. The voltage regulator 360 provides a steady DC voltage at a predetermined level. For example, the DC voltage may be +12 to +15 volts DC. The voltage regulator 360 may also be in communication with the PLD 356 or voltage regulator 352.

The switching circuit 302 can include one or more switches 332, 336. In some configurations, the switches 332, 336 may be transistors, for example, field effect transistors (FETs). In further configurations, the switches 332, 336 are Gallium Nitride FETs (GaNFETs). Regardless, the switches 332, 336 must switch high-voltage, high-current loads, 40+volts and one amp or more. These high voltages are required by the amplifiers 224, 228 to increase the gain of the signal being sent to the antenna 244. Further, the switches 332, 336 must be capable of handling to dissipate high current while switching at high speeds and/or in short time periods, for example, in under 100 nanoseconds. Thus, the switches 332, 336 must meet the above or similar parameters, which allows the switches to be used to switch an RF power amplifier. An example of the switches 332, 336 may be as shown and described in conjunction with FIG. 5C.

Hereinafter, an example RF amplifier 224, 228, with an example switching circuit 302, is provided in FIGS. 4 through 5C. The example circuit in FIGS. 4 through 5C is designed for a pulsed Doppler radar operating at 1-2 GHz and 1000 Watts, through the power amplifier stages 224, 228. It should be noted that the circuit 300 is not limited to the circuit configurations shown in FIGS. 4 through 5C but may be changed to meet many different RF designs, requirements, configurations, etc. Thus, the circuit configurations shown in FIGS. 4 through 5C may have specific capacitance, resistance, and/or inductance values as shown in FIGS. 4-5C. However, these values are based on a particular design specification and may be changed as understood by skilled in the art. However, this circuit gives an example to those skilled in the art to better explain the switching circuit described herein.

An example embodiment of one possible power amplifier circuit that may be in the multi-stage power amplification 228 or driver amplifier 224 may be as shown in FIG. 4. An input RF signal 420 may enter the circuit 224/228, an isolator 408 may then isolate the power amplifier circuit 224/228 from other circuitry connected before the isolator 408. The isolator 408 may be, for example, a C2ZE2 circulator manufactured by Sonoma Scientific Inc. of Minden, Nev. With the load resistor 410 connected to the circulator 408, the circulator 408 becomes the isolator 408.

The output from the isolator 408 enters an impedance matching network 412, with a capacitor and resistor. The impedance matching network 412 helps match the impedance of the input circuitry to the output impedance of the RF circuit 224/228, and, as such, the values of the resistor and capacitor are specific to the implementation of the RF amplifier 224/228 and the RF system 200. The output of the matching network 412 enters a DC blocking capacitor 414 before entering the power amplifier 404.

The power amplifier 404 may be a FET, as shown in FIG. 4. An example of the power FET 404 can be part CGHB 35-400F, which is an RF MOSFET manufactured by Wolfspeed, the RF division of Cree, of Durham, N.C. The drain 406 of the FET 404 may be connected to a 50V DC source 428. The DC source 428 may be provided by the switching circuit 302, which is described in more detail in FIGS. 5A through 5C. Thus, the weak RF signal 420 is sent through the FET 406 and is amplified with a gain of 10 or more decibels. The output is then sent through another isolator 416, which isolates the power amplifier 404 from downstream circuitry, before being output through output 424 to either another power amplification stage, in a multi-stage amplifier 228, or to the circulator 240 and on to the antenna 244. The inductors and capacitors circuitry 432, from the 50V input source 428 to the drain of the FET 404, can isolate the RF side, shown in FIG. 4, from the DC side of the circuit, provided by the switch 302 at connection 428.

Figure 5A:
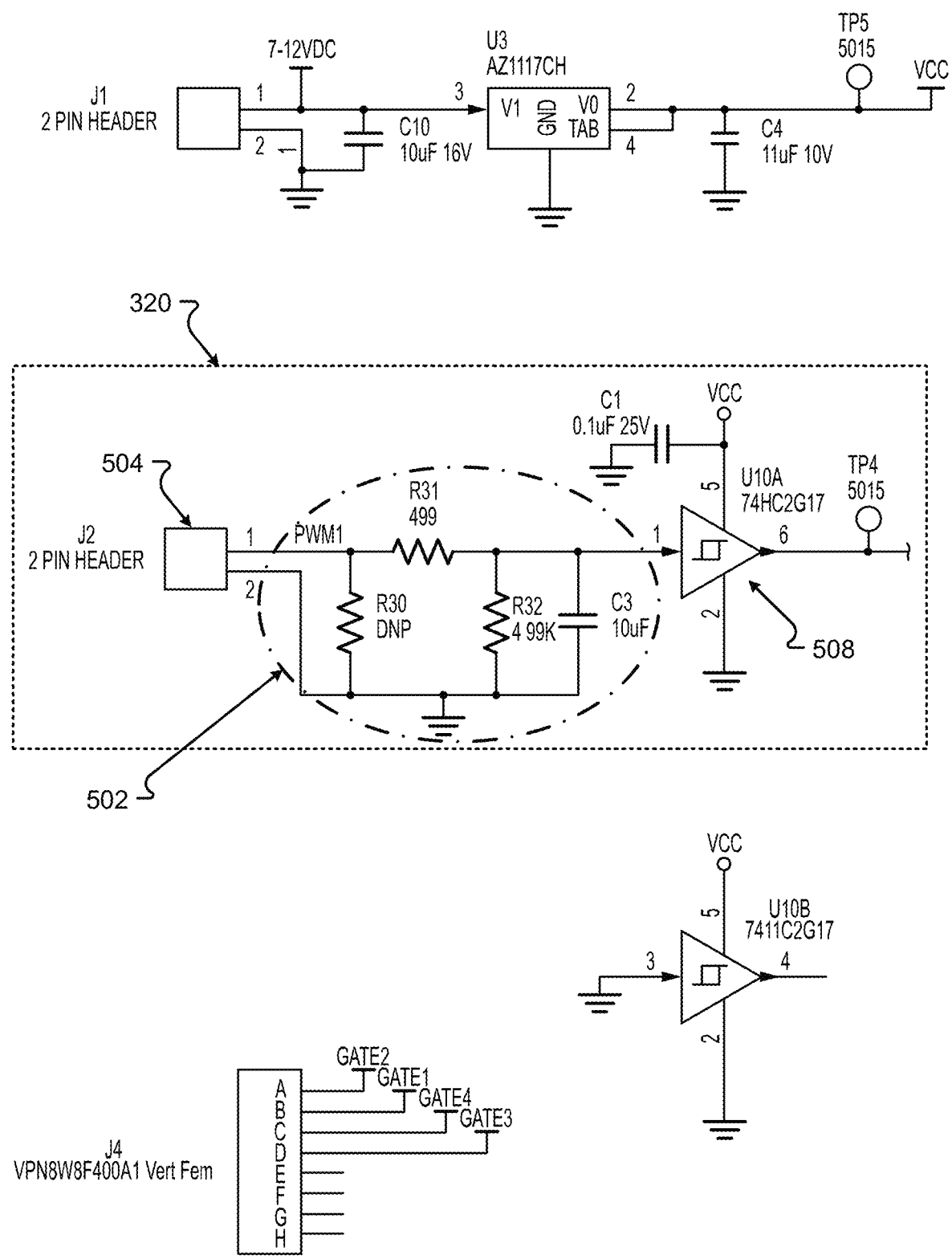
FIG. 5A is a first portion of a circuit diagram of the drain switching circuit connected to the RF power amplifier circuit in accordance with embodiments of the present disclosure.
Figure 5B:
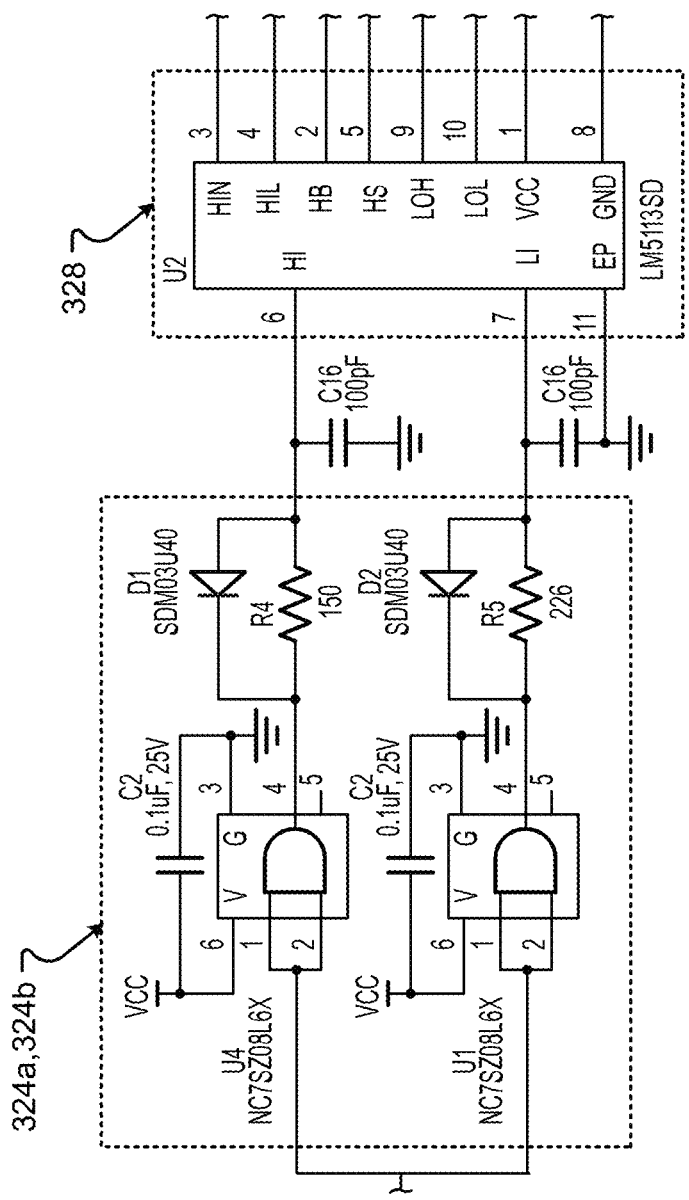
FIG. 5B is a second portion of a circuit diagram of the drain switching circuit connected to the RF power amplifier circuit in accordance with embodiments of the present disclosure.
Figure 5C:
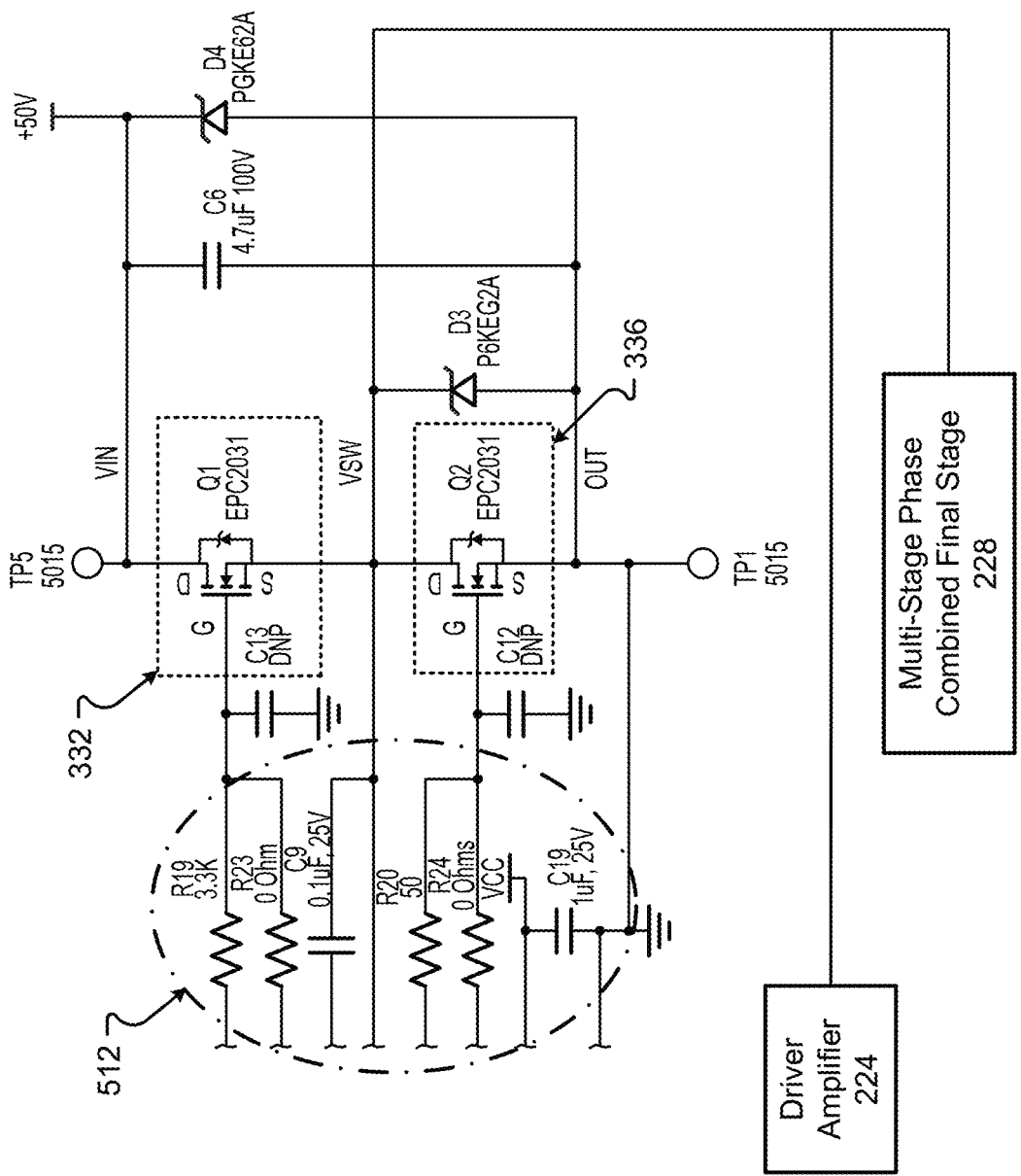
FIG. 5C is a third portion of a circuit diagram of the drain switching circuit connected to the RF power amplifier circuit in accordance with embodiments of the present disclosure.

An example of the switching circuit 302 may be as described in conjunction with the FIGS. 5A through 5C. Thus, each of the circuits shown in FIGS. 5A through 5C are portions of the same circuit 302 connected in succession as shown in FIG. 3. The dual Schmitt trigger buffer 320 may be as shown in FIG. 5A. A pin header 504 can be connected to a trigger source (not shown) and receive a trigger signal. The trigger signal 316 can be sent from a system trigger or may be a signal sent from the RF envelope detector 348 or some other component. The trigger 316 can be a 5 v TTL signal, or some other type of signal. The signal 316 enters the Schmitt trigger 320, and is output as a 5 v digital trigger signal outgoing to help trigger the switches 332, 336. Only one side of the dual Schmitt trigger buffer 320 may be used. Thus, the Schmitt trigger 508 may be the only side used in the part shown in FIG. 5A. An example of a Schmitt trigger 508 may be part number 4748C2G17, which may be a dual non-inverting Schmitt trigger, provided or manufactured by Nexperia Incorporated of Nijmegen, Netherlands. The digital trigger signal output from the Schmitt trigger 508 may then be sent on to the IC gates 324a and 324b, which are shown in FIG. 5B.

The IC gates 324 can be NAND gates, for example, part number NC7SCO8L6X, manufactured by Fairchild Semiconductor of Sunnyvale, Calif. The NAND gate 324 provides for the output, a gate driver signal, to the high-side/low-side gate driver 328 and ensures switching to the high signal at the correct input. The gates 324 provide for a gate driver signal as described in conjunction with FIG. 3 and allow for the proper signaling of the gate driver 328.

The gate driver 328 is operable to drive the switches 332 and 336. An example of the gate driver 328 may be part number LM5113SD, which is a half-bridge gate driver for enhanced mode GaNFETs, manufactured by Texas Instruments of Dallas, Tex. The high output (Hi signal) of the gate driver 328 may be provided through resistor network 512 to the on GaNFET 332, which functions as the switch to provide the 50V DC power to the power amplifier 404. The low output (Low signal) of the gate driver 328 controls the off state GaNFET 336, which rapidly drives the voltage at the drain 406 of the power amplifier MOSFET 404 to ground. Examples of the switches 332 and 336 may be as shown in FIG. 5C.

As shown in FIG. 5C, the switches 332 and 336 can be transistors, for example, GaNFETs. The GaNFETs are exemplary switches, but provide the necessary characteristics for high-speed switching at high current and voltage for the power MOSFET 404. An example of the switches 332, 336 may be part number EPC2031, which is an enhancement mode power transistor, and is manufactured or provided by Efficient Power Conversion Corporation of El Segundo, Calif. The GaNFETs 332, 336 are connected in a H-bridge configuration. In a H-bridge configuration, the GaNFETs 332, 336 can quickly switch the drain of the power MOSFET 404 to 50 volts, and in the off state, quickly switch the voltage level to drive the drain voltage at the power MOSFET 404 to ground. The output of the H-bridge configuration may then be connected to the multi-stage phase combined final stage 228 or driver amplifier 224, as the 5 ov DC source, as is shown in FIG. 5C and FIG. 4. The other circuitry within FIGS. 4-5C may be particular to the implementation of this circuit, which is for a pulsed Doppler radar. The circuit configuration may be changed based on the particular requirements of some other systems and thus is not so limited to the circuitry, including the values, for resistors, capacitors, inductors, etc., presented in FIGS. 4 through 5C.

Figure 6:
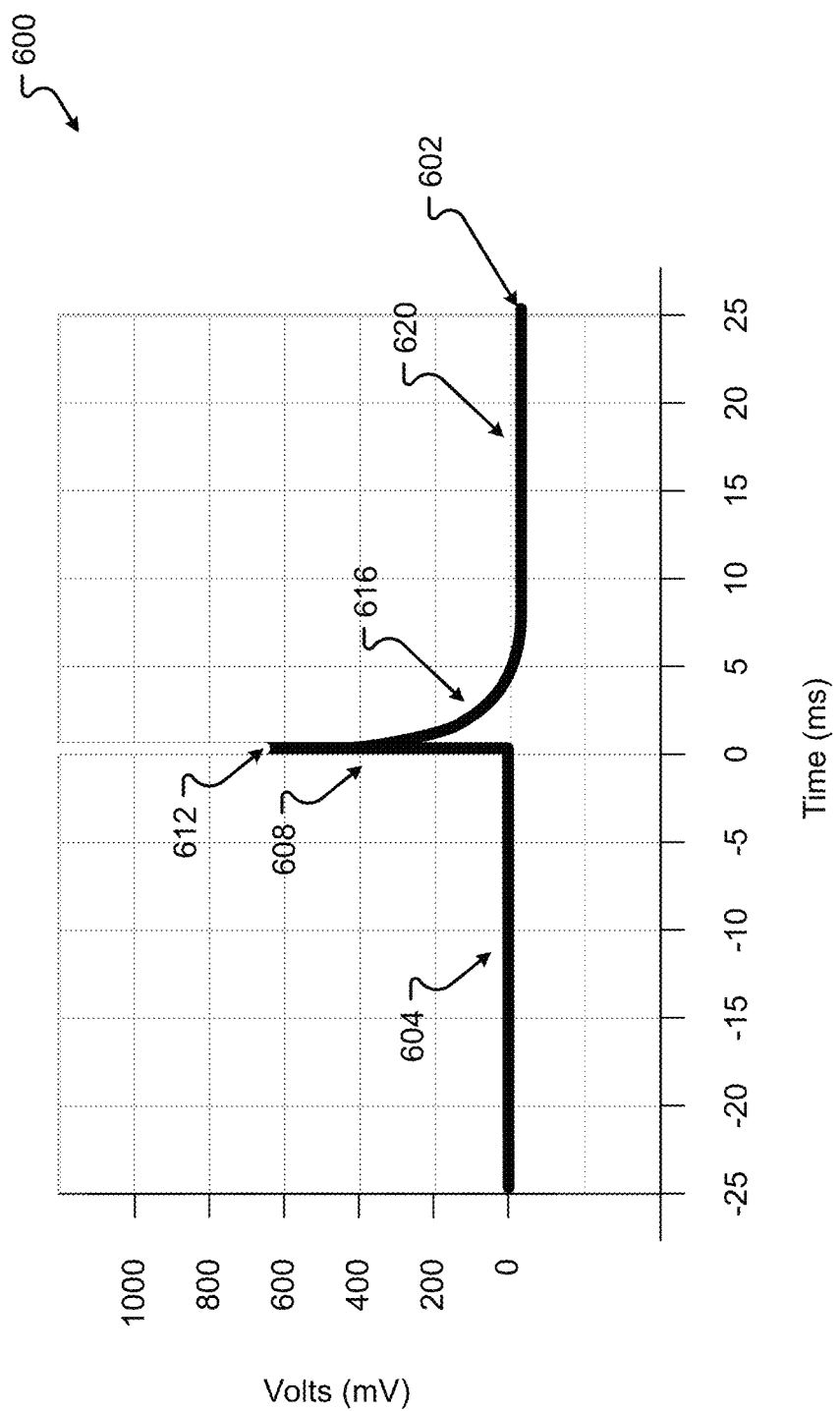
FIG. 6 is a signal diagram showing the triggering on of the RF power amplifier in accordance with embodiments of the present disclosure.

An embodiment of a signal generated by the circuitry, described in conjunction with FIGS. 2 through 5C, may be as shown in FIG. 6. The signal diagram 600 includes a first portion of the RF signal 602, which is near or substantially at ground. A leading edge 608 of a pulse in the signal 602 may then be received, which is created by the switching of the on-state GaNFET 332 to provide 50V DC power to the MOSFET 404. The peak 612 of the signal 602 is then reached and the RF envelope is terminated. Thereinafter, the slow dissipation of the current may be shown by the curve 616 for the signal 602. As such, the pulse is not a complete square wave, but has a trailing edge that is not succinct. The signal eventually returns substantially to ground, as shown in portion 620. Thus, the signaling diagram of FIG. 6 shows the effects of not using the off-state GaNFET 336 but does demonstrate the sharp and rapid increase in gain from fast switching of the power from ground to 50V without needing to maintain the drain voltage at or near 50V DC. The timing of the signal shown in FIG. 6 may be in milliseconds or less, which demonstrates the quick transition to the on state.

Figure 7:
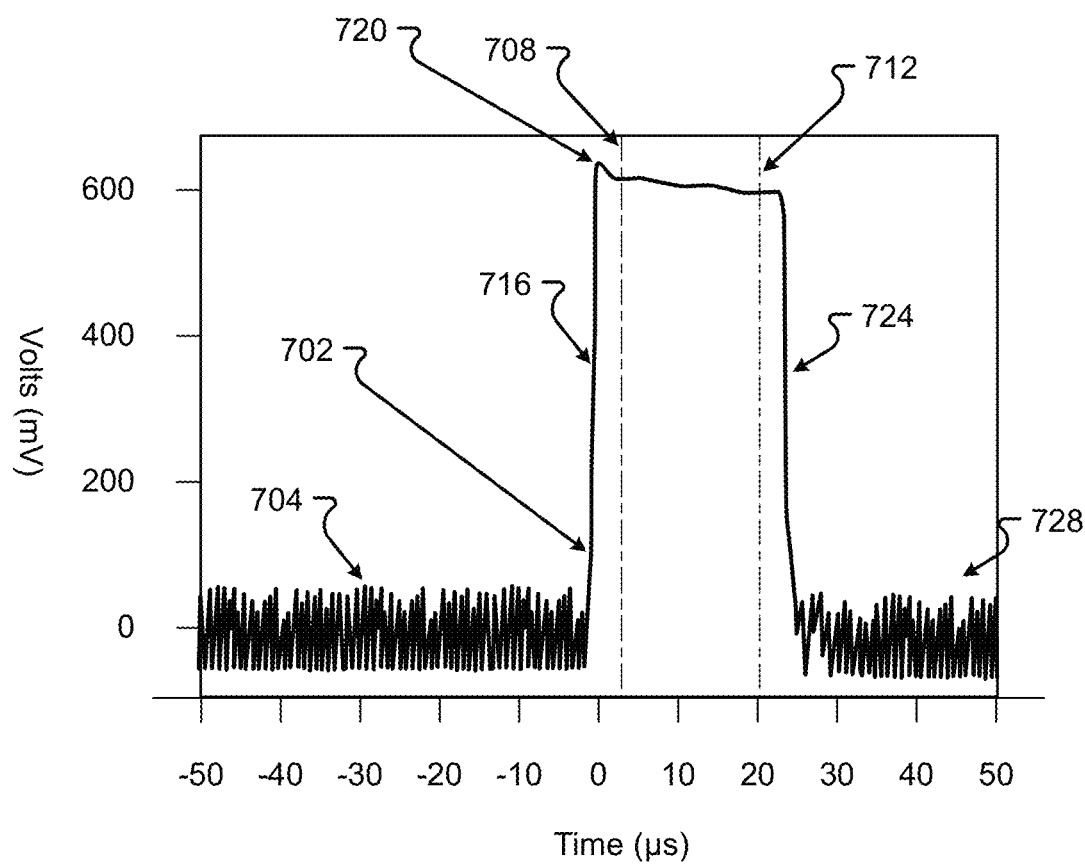
FIG. 7 is a signal diagram showing the triggering on and off of the RF power amplifier in accordance with embodiments of the present disclosure.

A representation of the drain voltage at the transistor 404 may be as shown in FIG. 7. The signal 702, at the drain 406, may first be provided near or substantially at ground, as shown in portion 704. However, as shown in FIG. 7, there may be noise within the signal 702, but the noise level is de minimus and causes no issues for the detection or transmission of the RF signal. Before beginning the RF envelope, as indicated by dashed line 708, the GaNFET 332 is switched on, providing a leading edge 716 of the DC voltage signal pulse 702, at the drain 406 of MOSFET 404. This leading edge 716 rises to a peak voltage level 720 before the beginning of the RF envelope, represented by line 708. The DC voltage signal is provided until after the RF envelope ceases, represented by line 712. The trailing edge 724 of the signal 702, created by switching off the on state GaNFET 332 and turning on the off state GaNFET 336, shows the quick dissipation of the current and voltage at the drain 406. The GaNFETs 332, 336 provide a a sharp trailing edge 724, which brings the signal voltage DC substantially back to ground, as shown in portion 728 of signal 702. Thus, the power to the MOSFET 404 is rapidly turned off, while quickly establishing and maintaining the voltage level during RF envelope.

Figure 8:
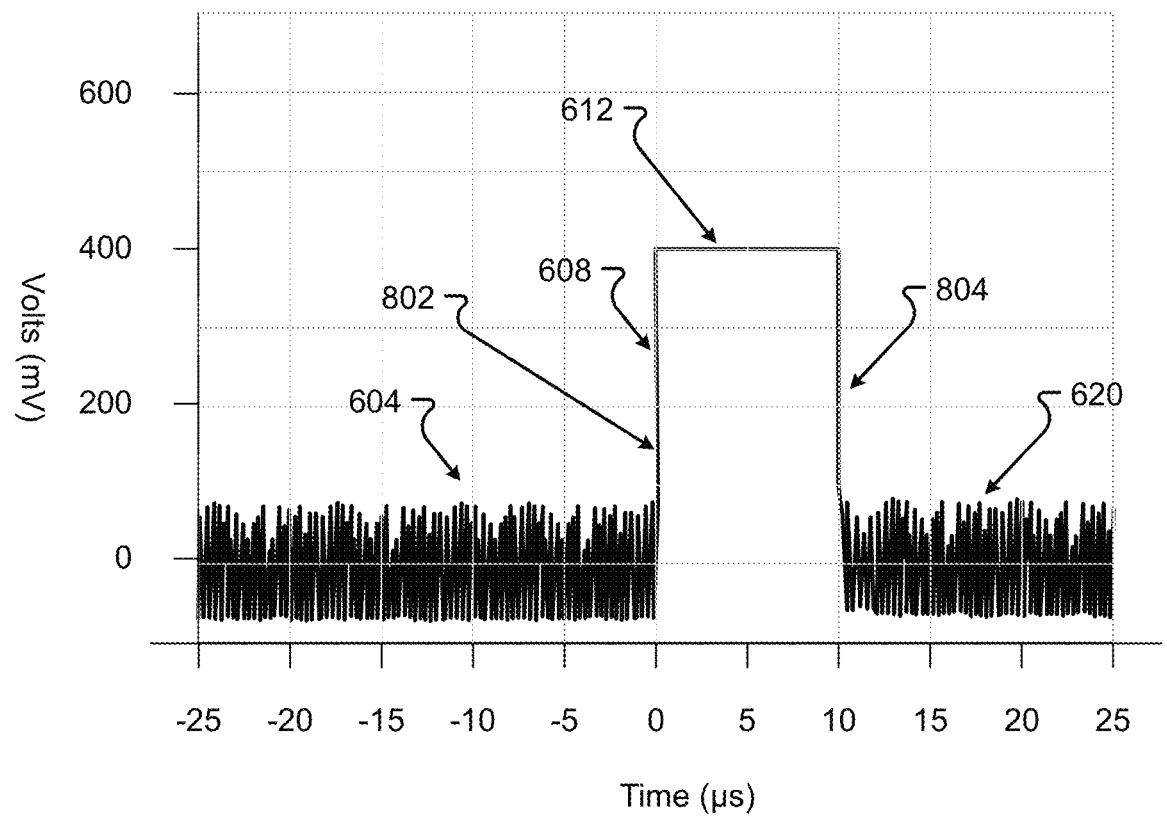
FIG. 8 is a signal diagram showing the triggering on of the RF power amplifier in accordance with embodiments of the present disclosure.

The resultant RF signal 802 produced by the MOSFET 404, controlled by the switching of the DC voltage at the drain 406, may be as shown in FIG. 8. Here, the initial portion 604 of the signal 602 is shown near or substantially at ground, however, containing some negligible noise. A rapid transition to the on state is shown, with a leading edge 608 of the pulse occurring with nanoseconds. The peak gain 612 is realized during transmission of the signal 802 and maintained for a period of time (e.g., 10 microseconds). The falling edge 804 is reached and the signal rapidly drops near or substantially to ground in portion 620. The falling edge 804 of the signal 802 also occurs within nanoseconds. Thus, a near perfect square wave pulse is produced with nanosecond switching between low and high states and between high and low states. This waveform 802 ensures the benefits mentioned above with minimizing power loss, minimizing heat generation, minimizing signal noise, etc.

Figure 9:
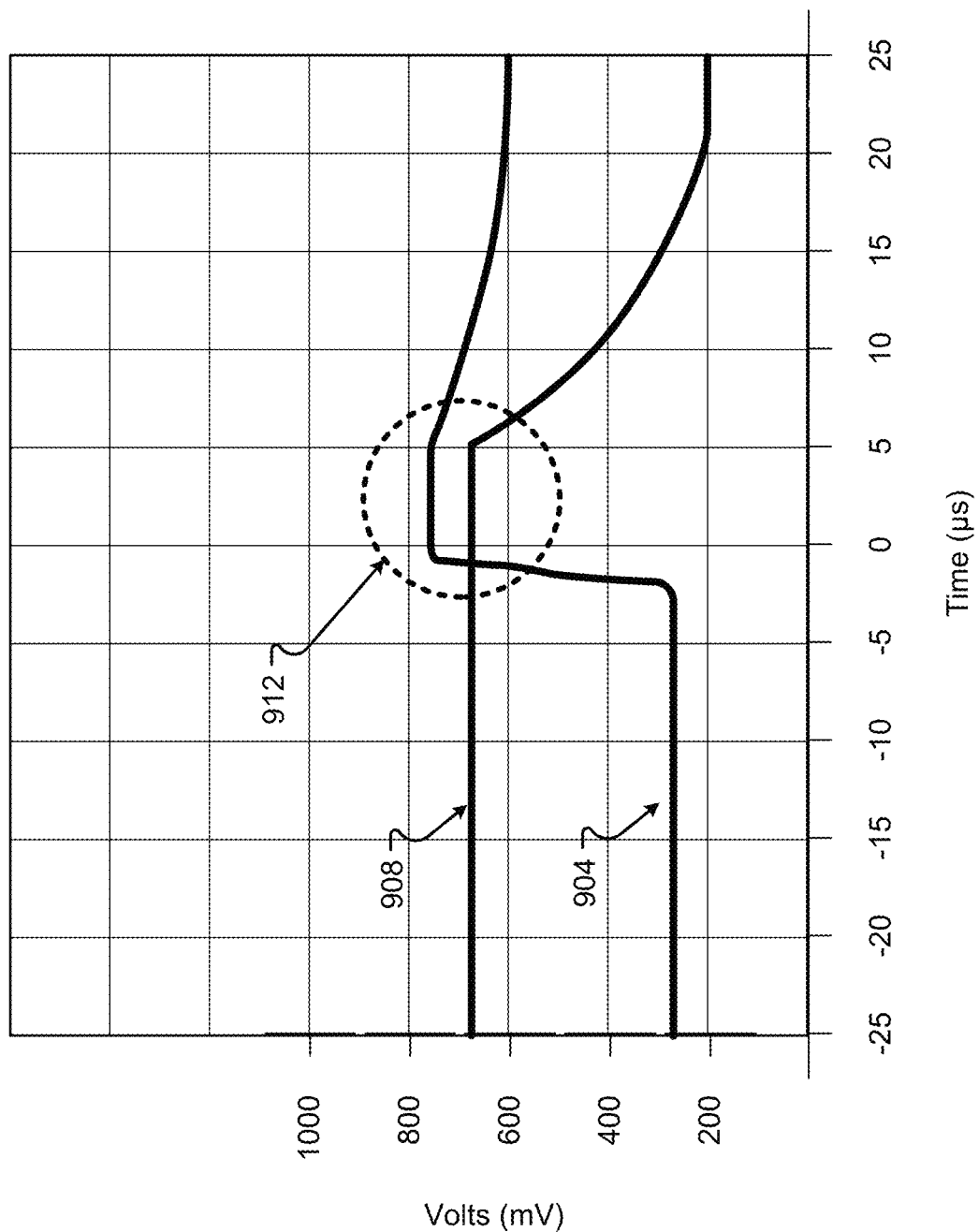
FIG. 9 is a signal diagram showing the triggering on of the RF power amplifier in accordance with embodiments of the present disclosure.

An embodiment of a signal diagram 900 that shows the signal 904 for switching on of the on state GaNFET 332 and the signal 908 for the switching off of the off state GaNFET 336 is shown in FIG. 9. As shown, the on state GaNFET 332 is triggered on at some time before the off state GaNFET 336 is turned off, shown in section 912. This overlapping of signals ensures that the DC voltage will not be applied across one of the GaNFETs 332, 336 causing a short or failure and allows the GaNFET 332, 336 to reach the desired operating characteristics at the appropriate time.

Figure 10:
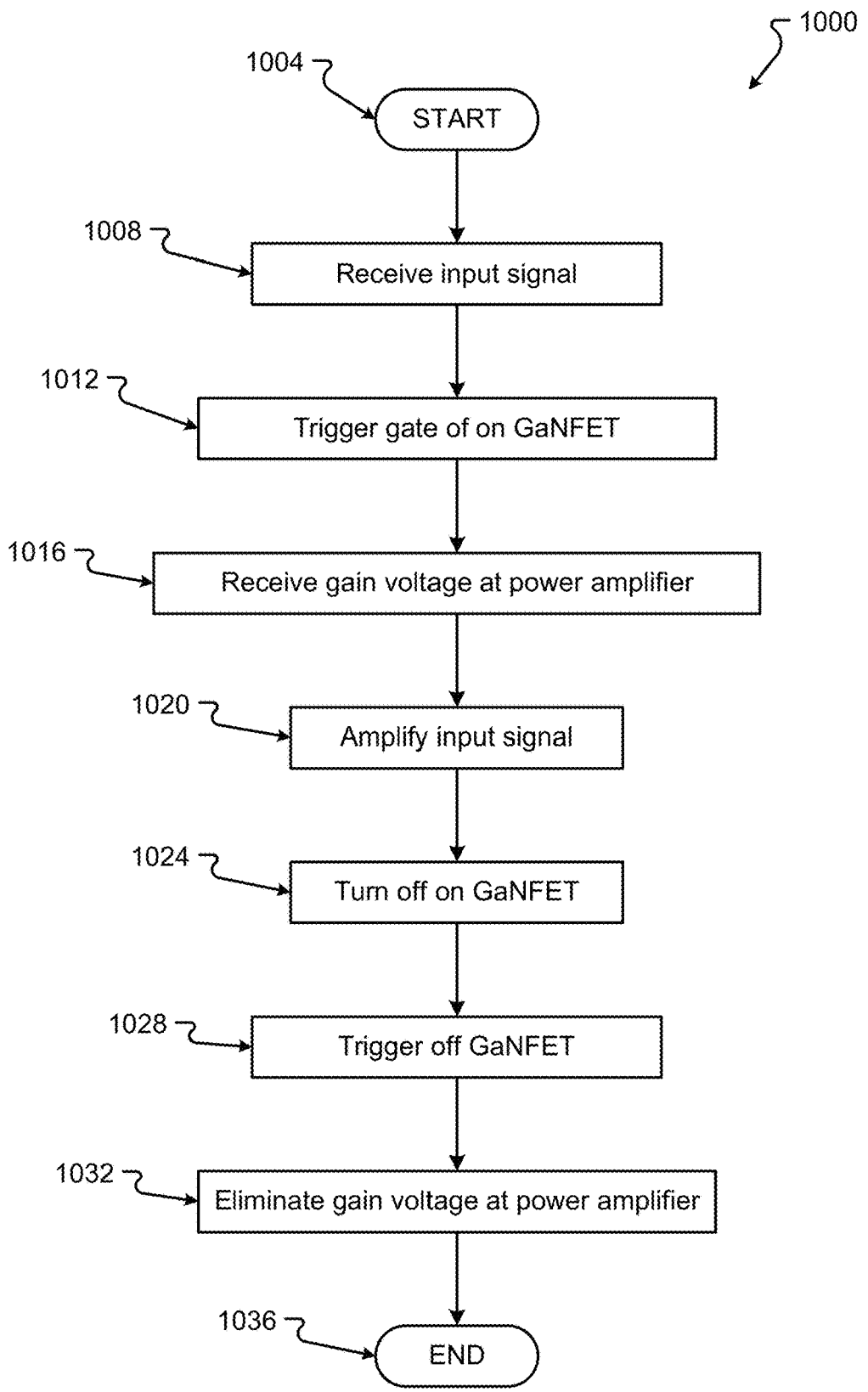
FIG. 10 is a process diagram showing a method for switching on and off a RF power amplifier in accordance with embodiments of the present disclosure.

An embodiment of a method 1000 for switching the RF power amplification stage 224, 228 may be as described in conjunction with FIG. 10. Generally, the method 1000 begins with a start operation 1004 and terminates with an end operation 1036. While a general order for the steps of the method 1000 are shown in FIG. 10, the method 1000 can include more or fewer steps or arrange the order of the steps differently than those shown in FIG. 10. The method 1000 can, at least partially, be executed as a set of computer-executable instructions, executed by a device, e.g., a PLD, or by a computer system or other processor, and encoded or stored on a computer readable medium. Further, the method 1000 can be executed by a gate(s) or other hardware device or component in an Application Specific Integrated Circuit, a Field Programmable Gate Array, or other type of hardware device. Hereinafter, the method 1000 shall be explained with reference to the systems, components, circuits, signals, etc. described herein with reference to FIGS. 1-9.

In step 1008, an input signal is received by the RF system 200. This input signal can be a system trigger to create or amplify a RF pulse or CW signal. The input signal can be used as a trigger source provided by an RF envelope detector 348, or provided as a trigger source 316. The trigger source 316 may then be provided to the switching circuit 302, in step 1012, which causes the triggering of the GaNFETs 332, 336 to provide the high-DC voltage to the drain 406 of the power MOSFET 404.

In step 1016, the input signal provided at input 420 may then be amplified by a gain voltage being applied at the power amplifier 404. The gain voltage may effect a gain of 10 decibels or more. The gain voltage, applied to the drain 406, then amplifies the input signal 420, in step 1020. It is possible that the output of a power amplifier 404 may be provided as an output 424 into another power amplifier 404. The multi-stages of power amplification may be as described in conjunction with component 228, in FIG. 3, which can progressively increase the power or gain of the output signal. The output signal may then be sent through a circulator 240 to an antenna 244 to be transmitted.

At some time thereinafter, the signal is terminated. The termination of the signal causes the GaNFET 332 to turn off, in step 1024, and causes the contemporaneous GaNFET 336 to turn on, in step 1028. The switching of the GaNFETs 332, 336 ceases the provision of the 50V DC gain voltage to the drain 406 of the MOSFET 404, in step 1032. With the switch of these GaNFETs 332, 336 shown in FIG. 5C, the voltage applied to the drain 406 is quickly driven to ground. These steps create the square pulse signal described in conjunction with FIG. 8.

Any of the steps, functions, and operations discussed herein can be performed continuously and automatically.

The exemplary systems and methods of this disclosure have been described in relation to radar systems. However, to avoid unnecessarily obscuring the present disclosure, the preceding description omits several known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

Furthermore, while the exemplary embodiments illustrated herein show the various components of the system collocated, certain components of the system can be located remotely, at distant portions of a distributed network, such as a LAN and/or the Internet, or within a dedicated system. Thus, it should be appreciated, that the components of the system can be combined into one or more devices, such as a server, communication device, or collocated on a particular node of a distributed network, such as an analog and/or digital telecommunications network, a packet-switched network, or a circuit-switched network. It will be appreciated from the preceding description, and for reasons of computational efficiency, that the components of the system can be arranged at any location within a distributed network of components without affecting the operation of the system.

Furthermore, it should be appreciated that the various links connecting the elements can be wired or wireless links, or any combination thereof, or any other known or later developed element(s) that is capable of supplying and/or communicating data or electricity to and from the connected elements. Transmission media used as links, for example, can be any suitable carrier for electrical signals, including coaxial cables, copper wire, fiber optics, etc.

While the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as a program embedded on a personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the embodiments that may reference particular standards and protocols, the disclosure is not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether such alternate, interchangeable and/or equivalent structures, functions, ranges, or steps are disclosed herein, and without intending to publicly dedicate any patentable subject matter.

Embodiments include a radio frequency (RF) circuit, comprising: a voltage source that supplies gain voltage; a power amplifier; and a switch electrically coupled to the voltage source, ground, and the power amplifier, wherein the switch selectively applies the gain voltage to the power amplifier and/or selectively applies ground to the power amplifier.

Any of the one or more above aspects, wherein the power amplifier is a RF amplifier.

Any of the one or more above aspects, wherein the radio frequency amplifier is a power RF metal oxide fiend effect transistor (MOSFET).

Any of the one or more above aspects, wherein the gain voltage is applied to a drain of the power RF MOSFET.

Any of the one or more above aspects, wherein the voltage source is a DC voltage source.

Any of the one or more above aspects, wherein the DC voltage source provides the gain voltage over 40 volts.

Any of the one or more above aspects, wherein the switch comprises a first on state switch and a second off state switch.

Any of the one or more above aspects, wherein the first on state switch is a Gallium Nitride field effect transistor (GaNFET) and the second off state switch is also a GaNFET.

Any of the one or more above aspects, wherein the first on state GaNFET and second off state GaNFET are connected in a H-bridge configuration.

Any of the one or more above aspects, wherein the first on state GaNFET electrically connects the power amplifier to the voltage source.

Any of the one or more above aspects, wherein the second off state GaNFET electrically connects the power amplifier to ground.

Any of the one or more above aspects, wherein the first on state GaNFET switches the gain voltage at the drain of the amplifier in less than 100 nanoseconds.

Any of the one or more above aspects, wherein the second off state GaNFET brings the drain to ground and dissipates a current at the drain in less than 100 nanoseconds.

Embodiments further include a method for controlling a radio frequency (RF) circuit, comprising: receiving a trigger signal; based on the trigger signal, switching an on state GaNFET, electrically coupled to a RF power metal oxide fiend effect transistor (MOSFET) amplifier, to connect a drain of the RF power MOSFET power amplifier to a DC voltage source; amplifying an RF signal with the RF power MOSFET amplifier while the on state GaNFET 15 switched; ending an RF envelope; based on ending the RF envelop: switching again the on state GaNFET; switching an off state GaNFET, also electrically coupled to the RF power MOSFET amplifier, to drive the drain of the RF power MOSFET amplifier substantially to ground; and discontinuing amplification of the RF signal with the RF power MOSFET amplifier.

Any of the one or more above aspects, wherein the power amplifier is a radio frequency (RF) amplifier.

Any of the one or more above aspects, wherein the DC voltage source provides the gain voltage for the RF power MOSFET amplifier.

Any of the one or more above aspects, wherein the on state GaNFET and the off state GaNFET are connected in a H-bridge configuration.

Any of the one or more above aspects, wherein the on state GaNFET switches the gain voltage at the drain of the amplifier in less than 100 nanoseconds.

Any of the one or more above aspects, wherein the off state GaNFET brings the drain to ground and dissipates a current at the drain in less than 100 nanoseconds.

Embodiments further include a RF circuit, comprising: a power amplification circuit comprising an RF power metal oxide fiend effect transistor (MOSFET) comprising at least a gate, a source, and a drain, wherein the power amplification circuit amplifies a received RF signal; a DC voltage source providing a gain voltage; a ground; a switching circuit electrically coupled to the drain of the RF power MOSFET, the switching circuit comprising: a Schmitt trigger to receive a trigger source and to convert the trigger source into a digital trigger signal; an IC gate electrically coupled to the Schmitt trigger to receive the digital trigger signal and supply a gate trigger signal; a gate driver electrically coupled to the IC gate to receive the gate trigger signal and to send a gate signal to a Hi gate signal and/or a Low gate signal; a first GaNFET electrically coupled to the gate driver, wherein, based on receiving the Hi gate signal, electrically coupling the DC voltage source to the drain of the RF power MOSFET to amplify the received RF signal, wherein the first GaNFET switches the drain to the gain voltage in less than 100 nanoseconds; and a second GaNFET electrically coupled to the gate driver and electrically coupled to the first GaNFET in an H-bridge configuration, wherein, based on receiving the Low gate signal, electrically coupling the ground to the drain of the RF power MOSFET to ceasing the amplification of the received RF signal, wherein the second GaNFET drive the drain to the ground in less than 10 nanoseconds.

Any one or more of the aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

The terms "determine," "calculate," "compute," and variations thereof, as used herein, are used interchangeably and include any type of methodology, process, mathematical operation or technique.

The term "radio frequency (RF)", as referred to herein, may refer to any of the electromagnetic wave frequencies that lie in the range extending from around 3 kHz to 300 GHz, which include those frequencies used for communications or radar signals. RF usually refers to electrical rather than mechanical oscillations.

The term "H Bridge", be an electronic switching circuit that enables voltages to be applied across a load in either direction.

The term "field effect transistor" (FET), as referred to herein, may be a transistor that uses an electric field to control the electrical behavior of the device. FETs are also known as unipolar transistors since FETs involve single-carrier-type operation. Many different implementations of FETs exist. FETs generally display very high input impedance at low frequencies. The conductivity between the drain and source terminals is controlled by an electric field in the device, which is generated by the voltage difference between the body and the gate of the device.

The term "metal oxide semiconductor field effect transistor" (MOSFET), as referred to herein, may be a type of FET. A MOSFET has an insulated gate, whose voltage determines the conductivity of the device. The ability to change conductivity with the amount of applied voltage can be used for amplifying or switching electronic signals. Although FETs are sometimes used when referring to MOSFET devices, other types of field-effect transistors also exist. Although the MOSFET is a four-terminal device with source (S), gate (G), drain (D), and body (B) terminals, the body (or substrate) of the MOSFET is often connected to the source terminal, making it a three-terminal device, like other field-effect transistors. Because these two terminals are normally connected to each other (short-circuited) internally, only three terminals appear in electrical diagrams.

The term "Gallium Nitride field effect transistor" (GaN-FET), as referred to herein, may be a FET manufactured using gallium nitride (GaN).

The term "power amplifier", as referred to herein, may be an electronic device that can increase the power of a signal (a time-varying voltage or current). An amplifier functions by using electric power from a power supply to increase the amplitude of the voltage or current signal. An amplifier is effectively the opposite of an attenuator: while an amplifier provides gain, an attenuator provides loss.

The term "amplifier", as referred to herein, may be either a separate piece of equipment or an electrical circuit contained within another device. Amplification is fundamental to modern electronics, and amplifiers are widely used in almost all electronic equipment. Amplifiers can be categorized in different ways. One is by the frequency of the electronic signal being amplified; RF amplifiers amplify frequencies in the radio frequency range between 20 kHz and 300 GHz. Another classification is by quantity of voltage or current being amplified; amplifiers can be divided into voltage amplifiers, current amplifiers, transconductance amplifiers, and transresistance amplifiers. A further distinction is whether the output is a linear or nonlinear representation of the input. Amplifiers can also be categorized by their physical placement in the signal chain. Today most amplifiers use transistors, but vacuum tubes continue to be used in some applications.

The term "multistage power amplifier", as referred to herein, may be a power amplifier that amplifies in two or more stages. A single-stage amplifier is often insufficient for many applications; hence several stages may be combined forming a multistage amplifier. These stages are connected in cascade, i.e., output of the first stage is connected to form input of second stage, whose output becomes input of third stage, and so on.

The term "Schmitt trigger", as referred to herein, may be a comparator circuit with hysteresis implemented by applying positive feedback to the noninverting input of a comparator or differential amplifier. It is an active circuit which converts an analog input signal to a digital output signal. The circuit is named a "trigger" because the output retains its value until the input changes sufficiently to trigger a change. In the non-inverting configuration, when the input is higher than a chosen threshold, the output is high. When the input is below a different (lower) chosen threshold, the output is low, and when the input is between the two levels the output retains its value. This dual threshold action is called hysteresis and implies that the Schmitt trigger possesses memory and can act as a bistable multivibrator (latch or flip-flop).

The term "decibel (dB)", as referred to herein, may be a logarithmic unit used to express the ratio of two values of a physical quantity. One of these values is often a standard reference value (e.g., a voltage), in which case the decibel is used to express the level of the other value relative to this reference. When used in this way, the decibel symbol is often qualified with a suffix that indicates the reference quantity that has been used or some other property of the quantity being measured. For example, dBm indicates a reference power of one milliwatt, while dBV is referenced to 1 volt RMS.

The term "bias", as referred to herein, may be a steady (DC) current or voltage that some electronic devices require to operate correctly. An AC signal applied to the devices can be superposed on this DC bias current or voltage.

The term "R-C coupling", as referred to herein, may be is the most widely used method of coupling in multistage amplifiers. In this case, the Resistance R is the resistor connected at the collector terminal and the capacitor C is connected in between the amplifiers. It is also called a blocking capacitor, since it will block DC voltage. The main disadvantage of this coupling method is that it causes some loss for the low frequency signals. However, for amplifying signals of frequencies greater than 10 Hz, this coupling is the best and least expensive method. It is usually applied in small signal amplifiers, such as in record players, tape recorders, radio receivers, etc.

In electronics, the term "gain", as referred to herein, may be a measure of the ability of a two-port circuit (often an amplifier) to increase the power or amplitude of a signal from the input to the output port by adding energy converted from some power supply to the signal. It is often expressed using the logarithmic decibel (dB) units ("dB gain").

In communications and electronic engineering, the term "intermediate frequency" (IF), as referred to herein, may be a frequency to which a carrier wave is shifted as an intermediate step in transmission or reception. The intermediate frequency is created by mixing the carrier signal with a local oscillator signal in a process called heterodyning, resulting in a signal at the difference or beat frequency. Intermediate frequencies are used in superheterodyne radio receivers, in which an incoming signal is shifted to an IF for amplification before final detection is done.

Conversion to an intermediate frequency is useful for several reasons. When several stages of filters are used, the filters can all be set to a fixed frequency, which makes them easier to build and to tune. Lower frequency transistors generally have higher gains so fewer stages are required. It is easier to make sharply selective filters at lower fixed frequencies. There may be several such stages of intermediate frequency in a superheterodyne receiver; two or three stages are called double (alternatively, dual) or triple conversion, respectively.

The term "continuous wave" or "continuous waveform" (CW), as referred to herein, may be an electromagnetic wave of constant amplitude and frequency; a sine wave.

What is claimed is:

1. A radio frequency (RF) circuit, comprising:
   a voltage source that supplies gain voltage;
   a power amplifier; and
   a switch electrically coupled to the voltage source, ground, and the power amplifier, wherein the switch selectively applies the gain voltage to the power amplifier and/or selectively applies ground to the power amplifier, wherein the switch brings the power amplifier to ground and dissipates a current at the power amplifier in less than 100 nanoseconds.

2. The RF circuit of claim 1, wherein the power amplifier is a RF amplifier.

3. The RF circuit of claim 2, wherein the radio frequency amplifier is a power RF metal oxide field effect transistor (MOSFET).

4. The RF circuit of claim 3, wherein the gain voltage is applied to a drain of the power RF MOSFET.

5. The RF circuit of claim 4, wherein the voltage source is a DC voltage source.

6. The RF circuit of claim 5, wherein the DC voltage source provides the gain voltage over 40 volts.

7. The RF circuit of claim 6, wherein the switch comprises a first on state switch and a second off state switch.

8. The RF circuit of claim 7, wherein the first on state switch is a Gallium Nitride field effect transistor (GaNFET) and the second off state switch is also a GaNFET.

9. The RF circuit of claim 8, wherein the first on state GaNFET and second off state GaNFET are connected in a H-bridge configuration.

10. The RF circuit of claim 9, wherein the first on state GaNFET electrically connects the power amplifier to the voltage source.

11. The RF circuit of claim 10, wherein the second off state GaNFET electrically connects the power amplifier to ground.

12. The RF circuit of claim 11, wherein the first on state GaNFET switches the gain voltage at the drain of the amplifier in less than 100 nanoseconds.

13. The RF circuit of claim 12, wherein the second off state GaNFET brings the drain to ground and dissipates a current at the drain in less than 100 nanoseconds.

14. A method for controlling a radio frequency (RF) circuit, comprising:
   receiving a trigger signal;
   based on the trigger signal, switching an on state GaN-FET, electrically coupled to a RF power metal oxide field effect transistor (MOSFET) amplifier, to connect a drain of the RF power MOSFET power amplifier to a DC voltage source;
   amplifying an RF signal with the RF power MOSFET amplifier while the on state GaNFET is switched;
   ending an RF envelope;
   based on ending the RF envelop:
   switching again the on state GaNFET;
   switching an off state GaNFET, also electrically coupled to the RF power MOSFET amplifier, to drive the drain of the RF power MOSFET amplifier substantially to ground, wherein switching the off state GaNFET brings the RF power MOSFET power amplifier to ground and dissipates a current at the RF power MOSFET power amplifier in less than 100 nanoseconds; and
   discontinuing amplification of the RF signal with the RF power MOSFET amplifier.

15. The method of claim 14, wherein the power amplifier is a radio frequency (RF) amplifier.

16. The method of claim 15, wherein the DC voltage source provides the gain voltage for the RF power MOSFET amplifier.

17. The method of claim 16, wherein the on state GaN-FET and the off state GaNFET are connected in a H-bridge configuration.

18. The method of claim 17, wherein the on state GaN-FET switches the gain voltage at the drain of the amplifier in less than 100 nanoseconds.

* * * * *